(12) United States Patent
Wong et al.

(10) Patent No.: US 6,377,047 B1
(45) Date of Patent: Apr. 23, 2002

(54) SUPERCONDUCTING BIRDCAGE COILS

(75) Inventors: Wai Ha Wong, San Jose; Marco A. Romo, Castro Valley, both of CA (US)

(73) Assignee: Varian, Inc., Palo Alto, CA (US)

( * ) Notice: Subject to any disclaimer, the term of this patent is extended or adjusted under 35 U.S.C. 154(b) by 14 days.

(21) Appl. No.: 09/589,847

(22) Filed: Jun. 8, 2000

(51) Int. Cl.[7] .................................................. G01V 3/00
(52) U.S. Cl. ....................................... 324/318; 324/322
(58) Field of Search ................................ 324/318, 319, 324/320, 321, 322, 309

(56) References Cited

U.S. PATENT DOCUMENTS

| | | | |
|---|---|---|---|
| 4,694,255 A | | 9/1987 | Hayes .......................... 324/318 |
| 5,258,710 A | * | 11/1993 | Black et al. .................. 324/309 |
| 5,276,398 A | * | 1/1994 | Withers et al. ............... 324/318 |
| 5,351,007 A | * | 9/1994 | Withers et al. ............... 324/322 |
| 5,565,778 A | | 10/1996 | Brey et al. .................... 324/318 |
| 5,585,723 A | * | 12/1996 | Withers ........................ 324/318 |
| 5,594,342 A | * | 1/1997 | Brey et al. ................... 324/322 |
| 5,619,140 A | * | 4/1997 | Brey et al. ................... 324/318 |
| 5,974,335 A | | 10/1999 | Talisa et al. |
| 6,121,776 A | | 9/2000 | Marek |
| 6,285,189 B1 | * | 9/2001 | Wong ........................... 324/318 |

FOREIGN PATENT DOCUMENTS

| | | | |
|---|---|---|---|
| EP | 1096266 A | * | 5/2001 |
| WO | WO 94/05022 | * | 3/1994 |

OTHER PUBLICATIONS

Conference Abstract by Wong, W.H. et al., entitled """"Millipede" Imaging Coil Design for High Field Micro Imaging Applications", published by Proc. Intl. Soc. Mag. Reson. Med. 8th Scientific Meeting and Exhibition, Denver, Colorado, USA, 1–7, Apr. 2000, vol. 2., p. 1399.

Article by Okada, H. et al., entitled "RF Coil for Low–Field MRI Coated With High–Temperature Superoonductor", published by Journal of Magnetic Resonance, Series B, vol. 107, pp. 158–164, May 1995.

Article by Wen, H., entitled "The Design and Test of a New Volume Coil for High Field Imaging", published by Magnetic Resonance in Medicine, vol. 32, pp. 492–498 (1994).

Article by Vullo et al., entitled "Experimental Design and Fabrication of Birdcage Resonators for Magnetic Resonance Imaging" published in *Magnetic Resonance in Medicine*, vol. 24, pp. 243–252 (1992).

Article by Wen et al., entitled "Experimental Design and Fabrication of Birdcage Resonators for Magnetic Resonance Imaging" published in *MRM*, vol. 32, pp. 492–498 (1994).

* cited by examiner

*Primary Examiner*—Edward Lefkowitz
*Assistant Examiner*—Tiffany A. Fetzner
(74) *Attorney, Agent, or Firm*—Bella Fishman

(57) ABSTRACT

Superconducting birdcage coil with low-pass and high-pass coil configurations are formed by using strips each with an elongated sapphire substrate with a layer of a high temperature superconductor (HTS) material grown in a wavy pattern over its entire length on one of its main surfaces. A low-pass coil is formed with a pair of ring elements made of an electrically conductive metal and a plurality of such strips arranged parallel to one another and interconnecting these ring elements at junctions which are spaced peripherally along each of the rings. At each of the junctions, the ring element and the HTS layer form a capacitance. A highpass coil is formed by a plurality of such strips each with electrodes of the HTS material also grown at two end positions separated from each other on the other main surface of its sapphire substrates. These strips are arranged parallel to each other and sequentially around a central axis, each lying in a plane which includes the center axis. The electrodes and the HTS layers on mutually adjacent pairs of strips are closely in face-to-face relationship so as to serve as the ring part of a birdcage configuration containing capacitors.

18 Claims, 5 Drawing Sheets

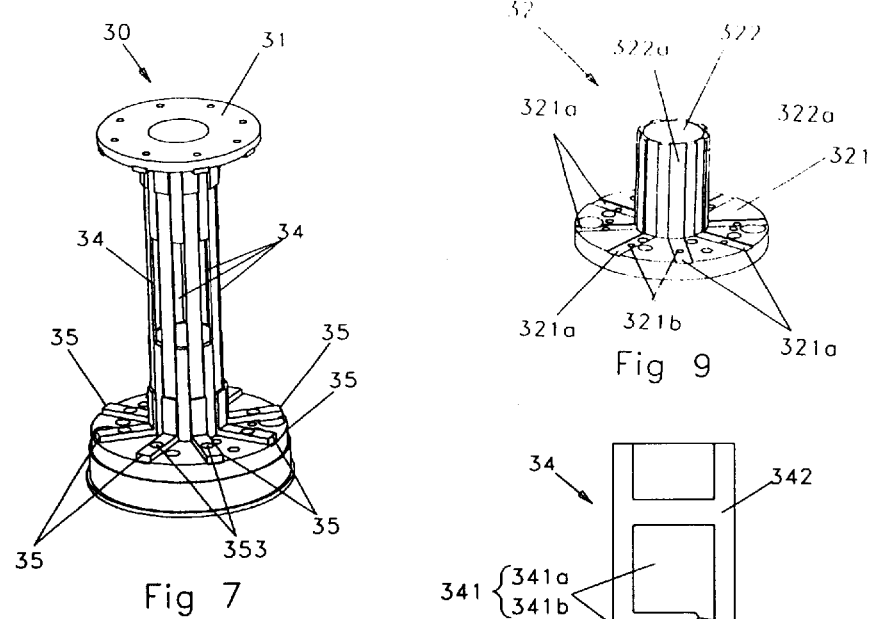
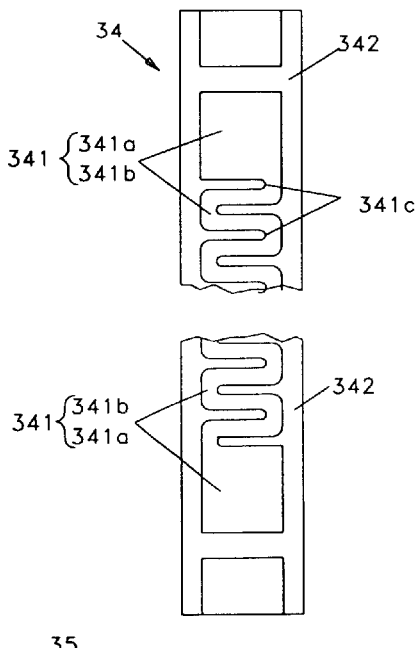
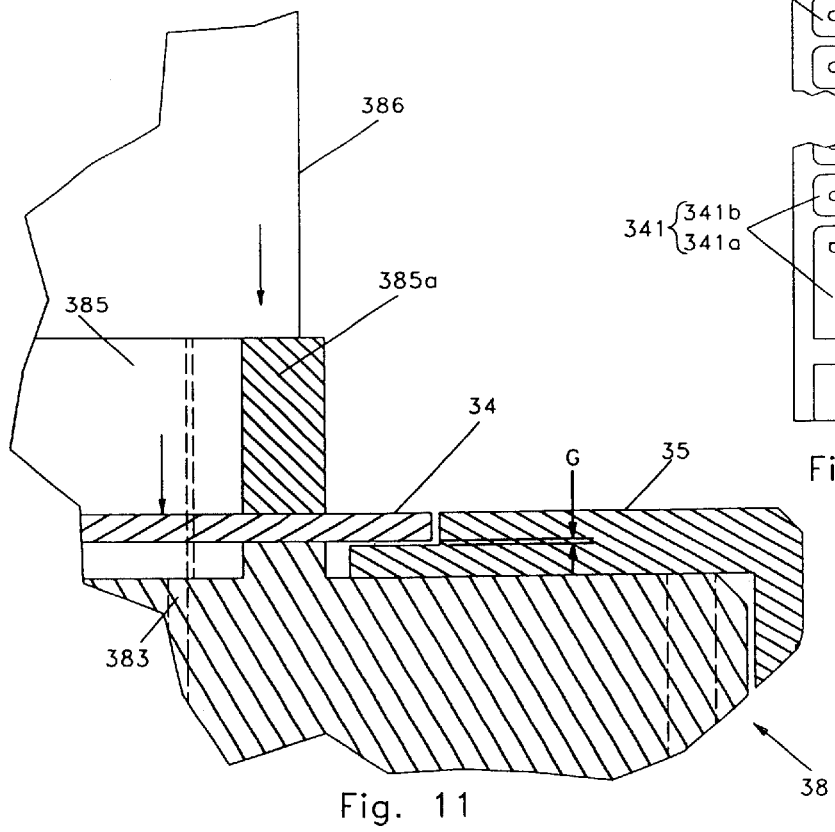

SUPERCONDUCTING BIRDCAGE COILS

BACKGROUND OF THE INVENTION

This invention relates to superconducting birdcage coils intended to be practical, for example, in high-resolution nuclear magnetic resonance (NMR) spectroscopy and micro imaging (MRI).

It has been known to structure a radio-frequency coil like a birdcage in order to obtain a highly homogeneous magnetic field as described, for example, in U.S. Pat. No. 4,694,255 issued Sep. 15, 1987 to C. Hayes and in the article "Experimental Design and Fabrication of Birdcage Resonators for Magnetic Resonance Imaging" (T. Vullo, et al., Magnetic Resonance in Medicine, 24, 243 (1992)). Birdcage coils are so called because of their general structure having a pair of loop-shaped conductive elements (the "rings") separated in a longitudinal direction and a plurality of conductive segments (the "legs") evenly spaced about the peripheries of and interconnecting these two loop-shaped conductive elements. Capacitors are inserted either in the legs, as shown in FIG. 1A for a low-pass coil, or in the rings, as shown in FIG. 1B for a high-pass coil.

The discovery of high temperature superconductors (HTS) has enabled many researchers to produce coils for various NMR applications with improved signal-to-noise ratio (as may be seen, for example, in U.S. Pat. No. 5,565,778). Thin films of a high temperature superconductor material such as $YBa_2Cu_3O_7$ (YBCO) are grown on substrates. The HTS films were grown two-dimensionally on substrates.

However, the attempt to utilize these substrates in the birdcage coil structure as described above created serious technical problems. A superconducting coil has to be operated under a condition of below the critical temperature of the HTS in order to be effective. Prior art capacitors of a conventional kind may not function reliably under a low-temperature condition in which the coil is required to operate, and they certainly do not have as high a Q value as a capacitor formed with a superconducting material.

SUMMARY OF THE INVENTION

It is therefore an object of this invention to provide superconducting birdcage coils using a superconducting material instead of conventional wires.

It is another object of this invention to provide such coils including built-in capacitors made with a superconducting material.

It is still another object of this invention to provide such superconducting birdcage coils with both low-pass and high-pass coil configurations.

A superconducting birdcage coil with low-pass coil configuration embodying this invention, with which the above and other objects can be satisfied, comprises a pair of ring elements made of an electrically conductive metal such as copper and a plurality of elongated members (the "strips") interconnecting these ring elements at junctions which are spaced peripherally along each of the rings to form a birdcage-like structure. Each of these strips has a layer of a high temperature superconductor grown on a substrate made of a material such as sapphire having a matching crystal structure with the superconductor grown thereon and a low dielectric loss. This high temperature superconductor layer and the ring elements sandwich the sapphire substrate at each of the junctions to form a capacitor of which the capacitance can be adjusted by the dimension of the portions of the high temperature superconductor layer. In order to control the inductive characteristic of the coil, the high temperature conductor layer on each of the strips is etched into a wavy pattern, or a serpentine pattern.

It is therefore a further object of this invention to provide an effective method of producing a superconductor birdcage coil as described above, as well as a device which may be used convenient for the production.

A method embodying this invention for this purpose may comprise the steps of providing and assembling a top base member and a bottom base member both of an electrically conductive material and each comprising a flange part and a cylindrical part for forming the top and the bottom parts of the birdcage, a plurality of "strips" as explained above each having a patterned high temperature superconductor layer formed on an elongated substrate and L-shaped brackets for attaching the strips to the top and bottom base members. One branch of each of the L-shaped brackets is attached by indium solder to one end of one of the strips while the other branch of each of these L-shaped brackets is attached to the flange part of the top or bottom member by means of a screw. The pattern on each strip includes capacitance-providing areas at each end part of the strip, and these capacitance-providing areas are positioned in a face-to-face relationship with the cylindrical part of the top or bottom base members so as to form capacitors therewith with a predetermined capacitance. Between the capacitance-providing areas, the pattern may be wavy, or serpentine, so as to provide a desired inductive characteristic.

L-shaped brackets are attached to each of the strips, utilizing a device embodying this invention. The device has a main body with a flat top surface and two oppositely facing side surfaces perpendicular to the top surface. The top surface is so dimensioned that attachment can be carried out by placing the two brackets each over an edge of the top surface abutting one of the side surfaces and the strip on a pair of vertical protrusions on the top surface such that end parts of the strip are above the branches of the brackets lying on the top surface of the device and by leaving a small gap left in between for applying an indium paste for their attachment. In order to firmly position the two brackets, each bracket has a screw-passing opening and the each side surface of the device has a screw-receiving opening such that horizontal screws can be passed through them in a coaxial relationship therebetween. In order to attach the strip to the brackets by means of the solder, Q-shaped clamps each with a horizontal protrusion and an elongated opening are placed on and pressed down by vertical screws with their positions adjusted such that their horizontal protrusions are on the strip and exactly where the strip is supported from below by the vertical protrusions.

A superconducting birdcage coil embodying this invention with high-pass coil configuration comprises a plurality of planar members disposed sequentially around a central axis, each being elongated in a longitudinal direction parallel to the central axis and lying within a plane which includes the central axis and extending radially from it. Each of these planar members has a high temperature superconductor layer grown over substantially the entire length on one of main surfaces of a sapphire substrate and electrodes of the same high temperature superconductor material are grown at two end positions separated from each other on the other of its main surfaces. Thus, each electrode has a capacitance with the high temperature superconductor layer on the opposite surface of the substrate, serving as an equivalent of one of these capacitors in the "rings" of a prior art birdcage coil described above.

BRIEF DESCRIPTION OF THE DRAWINGS

The accompanying drawings, which are incorporated in and form a part of this specification, illustrate embodiments of the invention and, together with the description, serve to explain the principles of the invention. In the drawings:

FIG. 7 is a diagonal view of another superconducting low-pass coil embodying this invention;

FIG. 8 is a plan view of one of the strips on the coil of FIG. 7;

FIG. 9 is a diagonal view of the bottom member of the coil of FIG. 7;

FIG. 11 is a sectional view of a portion of the strip placed on the device of FIG. 10 for showing the positional relationship among some of the components;

DETAILED DESCRIPTION OF THE INVENTION

Figure 1A:
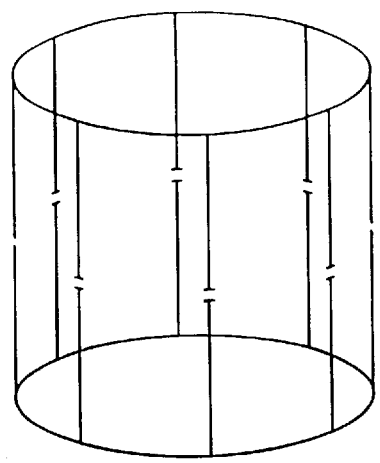
FIGS. 1A and 1B are sketches showing birdcage coils respectively with low-pass and high-pass coil configurations.
Figure 1B:
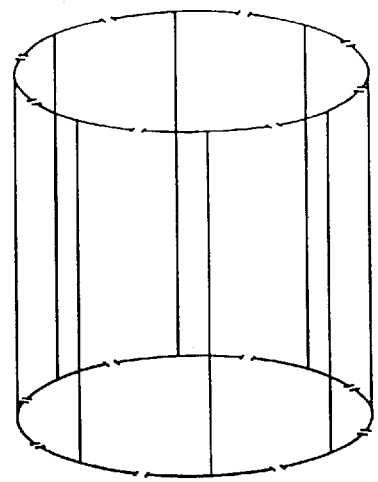
Figure 2:
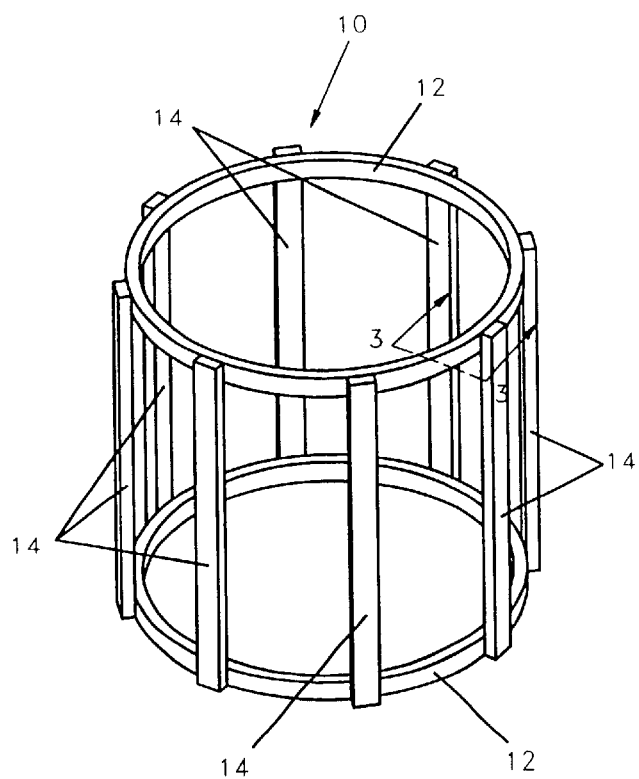
FIG. 2 is a schematic diagonal view of a superconducting low-pass coil embodying this invention.

FIG. 2 shows schematically the structure of a superconducting birdcage low-pass coil 10 embodying this invention. A pair of ring elements 12 made of an electrically conductive metal such as copper is placed in a mutually separated relationship in a longitudinal direction which is parallel to a central axis of the birdcage shape of the coil 10. A plurality of elongated members (herein referred to as the "strips") 14 extend longitudinally between the pair of ring elements 12, interconnecting them at end parts. These strips 14 are equally spaced peripherally along each of the ring elements 12 so as to form a birdcage structure. The number of these strips 14 does not limit the scope of the invention, and internally the number of the strips is eight and they are arranged in a four-fold symmetry.

Figure 3:
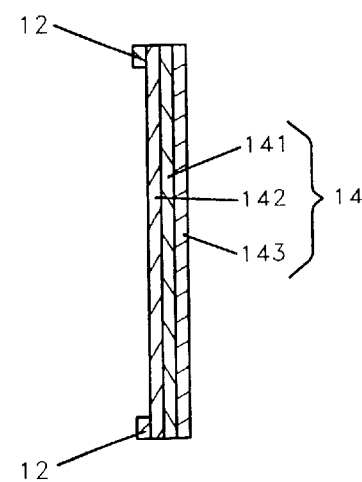
FIG. 3 is a sectional view of a portion of the low pass coil of FIG. 2 taken along line 3—3 therein.

Each strip 14 is of a three-layer structure, as shown in FIG. 3 more in detail, with a HTS layer 141 consisting of a thin film of YBCO grown entirely over a sapphire substrate 142 and covered by a protective layer 143 with an electrically conductive material such as Au or Ag not only for physically protecting the HTS layer 141 but also by serving as an electrical conductor in the event of a breaking of the HTS layer 141 so as to allow the HTS layer 141 to cool down and "heal" itself. At each end of the strip 14 where the strip 14 contacts one of the ring elements 12, it is the sapphire substrate 142 that contacts the ring element 12 directly. In other words, at each of the end parts of the strip 14, the sapphire substrate 142 is sandwiched between the corresponding one of the ring elements 12 and the HTS layer 141, thereby together forming a capacitor. The capacitance of this capacitor depends on the thickness of the substrate 142 as well as the area over which the strip 14 contacts the ring element 12, the dielectric constant of sapphire being known. Thus, the dimensions of the end parts of the strip 14 may be appropriately tailored in order to form a capacitor having a desired capacitance, depending on the application for which the coil 10 is to be used. Although sapphire was mentioned above as the material for the substrate 142, any other material such as $LaAlO_3$ and MgO having a matching crystal structure with the HTS layer 141 grown thereon and having a small dielectric loss (for example, having the imaginary part of the dielectric constant smaller than $10^{-4}$) may be used as the material for the substrate.

Figure 4:
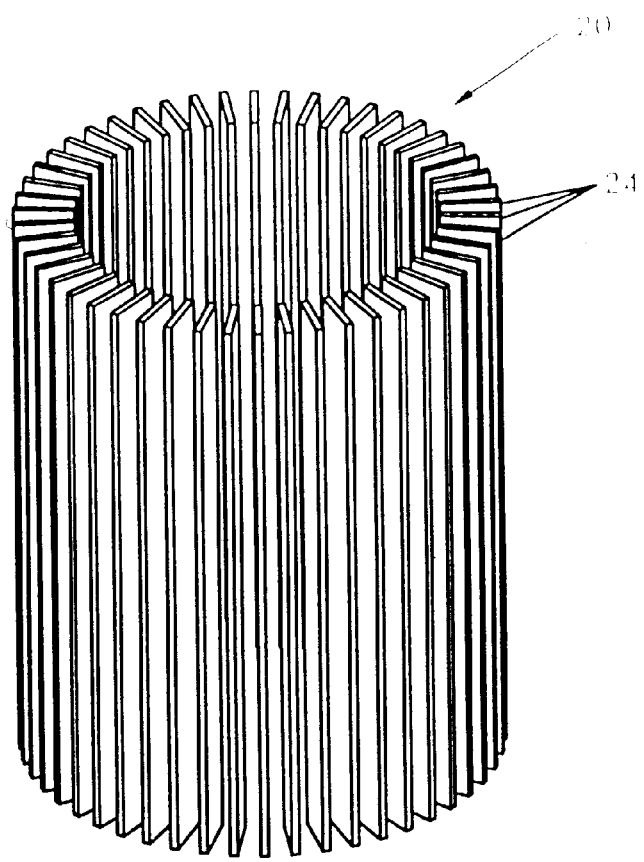
FIG. 4 is a schematic diagonal view of a superconducting high-pass coil embodying this invention.

FIG. 4 shows schematically the structure of a superconducting birdcage high-pass coil 20 embodying the present invention. A plurality of elongated members (herein referred to as the "strips") 24 are arranged so as to each extend longitudinally parallel therebetween and to a central axis and sequentially and equally spaced around this central axis, separated from it uniformly by a same distance so as to together assume a tubular cylindrical form. A support member which supports strips 24 in the manner described above is schematically shown by dotted lines in FIG. 4.

Figure 5:
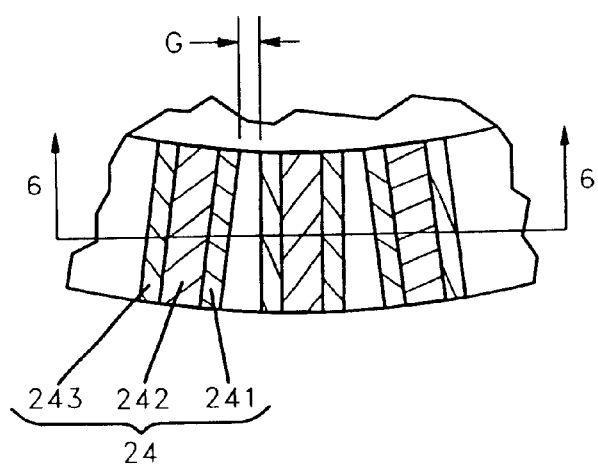
FIG. 5 is a top view of a portion of the high-pass coil of FIG. 4.
Figure 6:
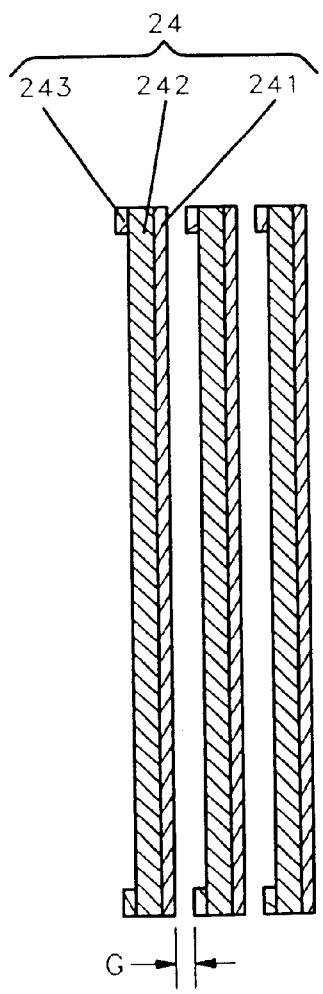
FIG. 6 is a sectional view of a portion of the high-pass coil of FIGS. 4 and 5 taken along line 6—6 of FIG. 5.

Each of the strips 24 is of a layered structure, as shown in FIGS. 5 and 6, with a HTS layer 241 consisting of a thin film of YBCO grown on one of the main surfaces (the "first main surface") over substantially the entire length of a planar sapphire substrate 242 which is elongated in the longitudinal direction and oriented so as to lie in a plane which includes the central axis. Thin-film electrodes 243 which may be of the same HTS material having a specified area are grown each at one of end parts on the other main surface (the "second main surface") of the substrate 242 mutually separated from each other in the longitudinal direction. Each of these thin-film electrodes 243, together with the HTS layer 241 on the opposite main surface of the substrate 242, serves to form a capacitor, the capacitance of which is determined by the thickness of the substrate 242 and the area of the thin-film electrode 243.

All strips 24 are arranged so as to face in the same direction around the central axis of the coil 20 such that the first main surface of each strip 24 is in a face-to-face relationship with the second main surface of the next one of the other strips 24 in their sequential arrangement. If the gap G (as shown in FIGS. 5 and 6) between the HTS layer 241 on the first main surface of each strip 24 and the thin-film electrode 243 on the second main surface of the adjacent one of the strips 24 is sufficiently small, they form another capacitor together, of which the capacitance is greater than that of the capacitor formed between the HTS layer 241 and the thin-film electrode 243 on the same strip 24. Since these two kinds of capacitors are effectively connected in series, the capacitors with a smaller value of capacitance are the dominant ones in determining the resonance characteristic of the coil 20.

Although the specific dimensions and the number of the strips 24 are not intended to limit the scope of this invention, as an example, the inner diameter of the cylindrical form of FIG. 6 is 7.5 mm and the thickness of each substrate 242 is 17 mils, about 54 strips may be arranged with the gap G of less than 1 mil. If each thin-film electrode 243 is a square with sides 0.1 inches long, for example, the capacitance of the capacitor formed thereby together with the HTS layer 241 will be about 1.4 pF.

Further, the invention will be described by way of a method of assembling a birdcage coil 30, shown in FIG. 7, of a kind generally explained above with reference to FIGS. 2 and 3, as well as a device which may conveniently be used for its assembly. For this example, eight strips 34 are prepared each with a thin HTS film 341 with a serpentine pattern formed on an elongated rectangular sapphire substrate 342 as shown in FIG. 8. The pattern includes capacitance-providing end areas 341a and a curving portion 341b in between in a serpentine form for controlling frequency. In order to allow electrons to flow as smoothly as possible therethrough, the serpentine pattern, formed by etching in a well known manner, is formed with smoothly rounded inner edges 341c (for example, in a semi-circular shape) where the electron path in the serpentine pattern makes a 180-degree change of direction. The capacitance-providing end areas 341a are for supplying specified capacitance, as will be explained below. For this purpose, it is important that they should have an accurately specified areal size. Thus, end areas 341a are formed on the substrate 342 so as to be retracted from its edges such that cutting of a mother sheet to obtain the individual substrates will not affect the shape or size of the individual capacitance-forming end areas 341a.

A base bottom member 32, shown separately in FIG. 9, made of an electrically conductive material and having a flange portion 321 provided with eight radially extending grooves 321a on its surface and a cylindrical part 322 provided with longitudinally extending grooves 322a on its peripheral surface, for mounting strips 34 thereto. A base top member 31, not separately shown, has a similar structure.

For mounting eight strips 34 between the top and bottom members 31 and 32 in a birdcage formation as shown in FIG. 7, a sixteen L-shaped brackets are used. L-shaped brackets, shown at 35 in FIG. 10 and having a base branch 351 with a screw-passing opening 351a therethrough and a strip-supporting branch 352 with a thinned end portion 352a having a sharp corner.

Figure 10:
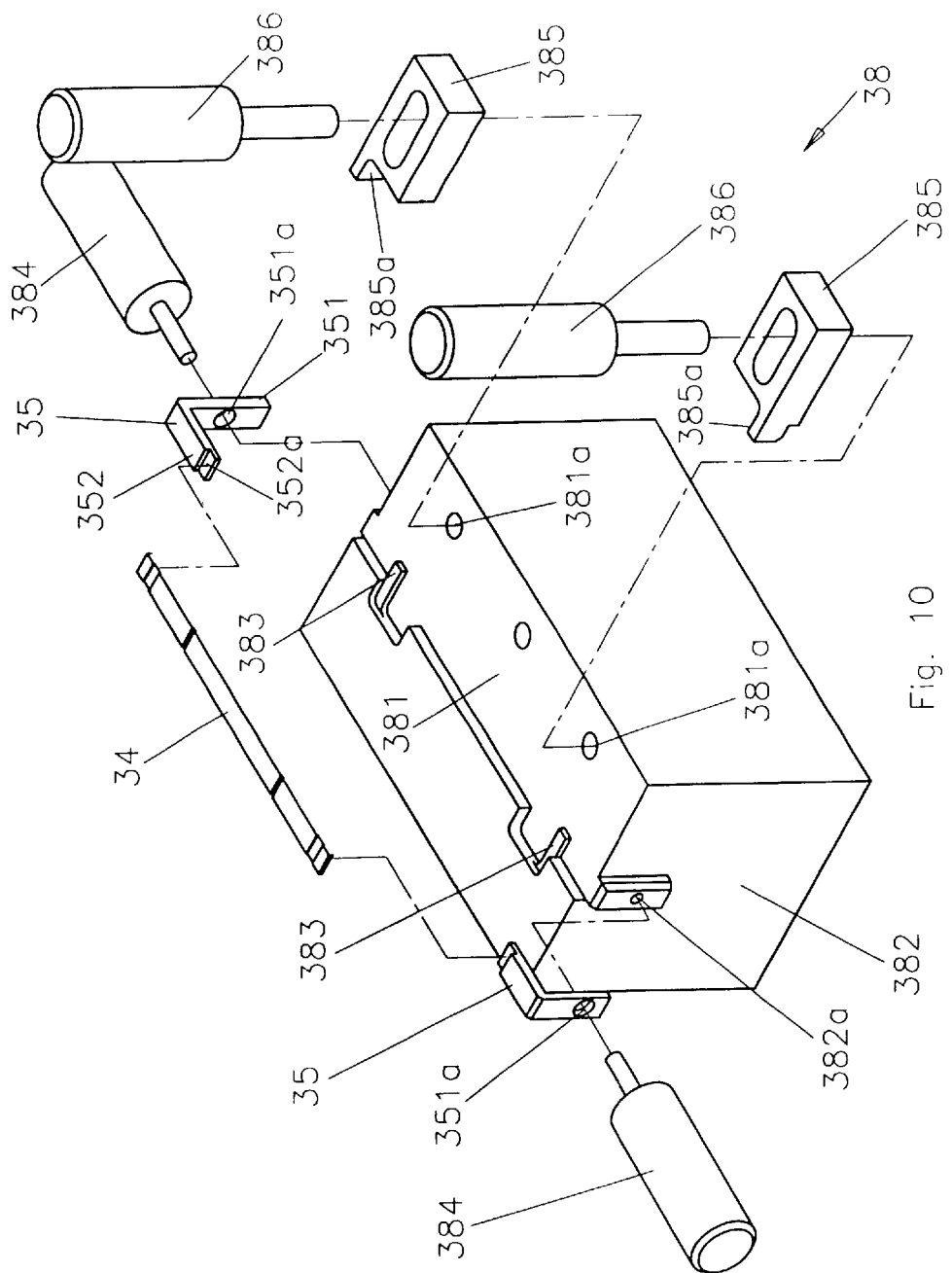
FIG. 10 is a diagonal view of a device which may be used for the assembly of the coil of FIG. 7 with some of its components shown separated.

A device shown generally at 38 in FIG. 10 may be convenien ty used for attaching two of these brackets 35 to each of the strips 34. The device 38 is made of a heat conductive material such as aluminum, having an overall rectangularly shaped flat top surface portion 381 and two mutually oppositely facing side surfaces 382 which are perpendicular and adjacent to the top surface portion 381. Protrusions ("vertical protrusions") 383 are provided on the top surface portion 381 for supporting one of the strips 34 thereon. For attaching the brackets 35 to the strip 34, the brackets are positioned, as indicated by broken lines in FIG. 10, each with its strip-supporting branch lying on the top surface portion 381 of the device 38 and its base branch 351 contacting a corresponding one of the side surfaces 382 provided with a screw-receiving opening 382a. The two screw-receiving openings 382a (one of which is not visible in FIG. 10) are provided in a coaxial relationship and such that a pair of horizontal screws 384 can be moved towards each other coaxially through the screw-passing openings 351a of the brackets 35 thus positioned and inserted into these screw-receiving openings 382a, thereby fastening these brackets with respect to the top surface portion 381 of the device 38.

The length of the top surface portion 381, or the distance between these two side surfaces 382, is such that when these two brackets 35 are thus fastened thereto, the end portions of the strip 34 will be exactly above the end portions 352a of the brackets 35, leaving a small gap G of about 2 mils thereabove, as schematically shown in FIG. 11. This gap is filled with an indium solder (not shown). The vertical protrusions 383 are provided at strategically selected in positions on the top surface portion 381 so as to contact the strip 34 outside its aforementioned capacitance-providing end areas 341a such that the HTS film on the strip 34 will not be contacted when the strip 34 is. thus properly positioned and the capacitance to be produced between the capacitance-providing end areas 341a and the cylindrical parts 322 of the top and bottom members 31 and 32 will have the value intended therefor.

With the strip 34 thus positioned on the vertical protrusions 383 and with its end portions directly about the thinned end portions 352a of the brackets 35, as shown in FIG. 11, generally Q-shaped clamps 38 each with an elongated hole therethrough and a horizontal protrusion 385a and having a vertical screw 386 passed through the elongated hole and inserted into a screw-receiving opening 381a provided on the top surface portion 381 of the device 38, as indicated by broken lines in FIG. 10, are positioned such that their horizontal protrusions 385a will be exactly above the vertical protrusions 383 with the strip 34 in between. The vertical screws 386 are then turned to have the strip 34 securely supported between the pairs of protrusions 383 and 385a where the HTS film 341 is not formed.

With the strip 34 thus securely supported, the device 38 as a whole is placed on top of a hot plate (not shown) set at about 160° C. in order to let the indium solder to flow and wet the strip 34. The temperature of the hot plate is selected in view of the melting temperature of the indium solder and also such that the HTS film 341 on the strip 34 will not be adversely affected by the heat of the hot plate. After a suitable length of time, the device 38 is removed from the hot plate and is cooled to room temperature. With the brackets 35 now securely attached to the strip 34, the screws 384 and 386 are removed and loosened and the strip 34 is lifted off from the device 38.

These strips 34 with brackets 35 soldered thereto at both ends, as described above, are mounted to the top and bottom memnbers as shown in FIG. 7 by sliding the base branch 351 of each bracket 35 into a corresponding one of the radially extending grooves 321a of the top or bottom member 31 or 32 such that its base branch 351 fits exactly into the corresponding one of the longitudinally extending grooves 322a on the cylindrical part 322. The base branches 351 of the brackets 35 are affixcd to the top and bottom base members 31 and 32 by means of screws 353 which are screwed into screw-receiving openings 321b provided inside the longitudinally extending grooves 321a (FIG. 9) through the screw-passing openings 351a of the brackets 35 (FIG.10).

Figure 12:
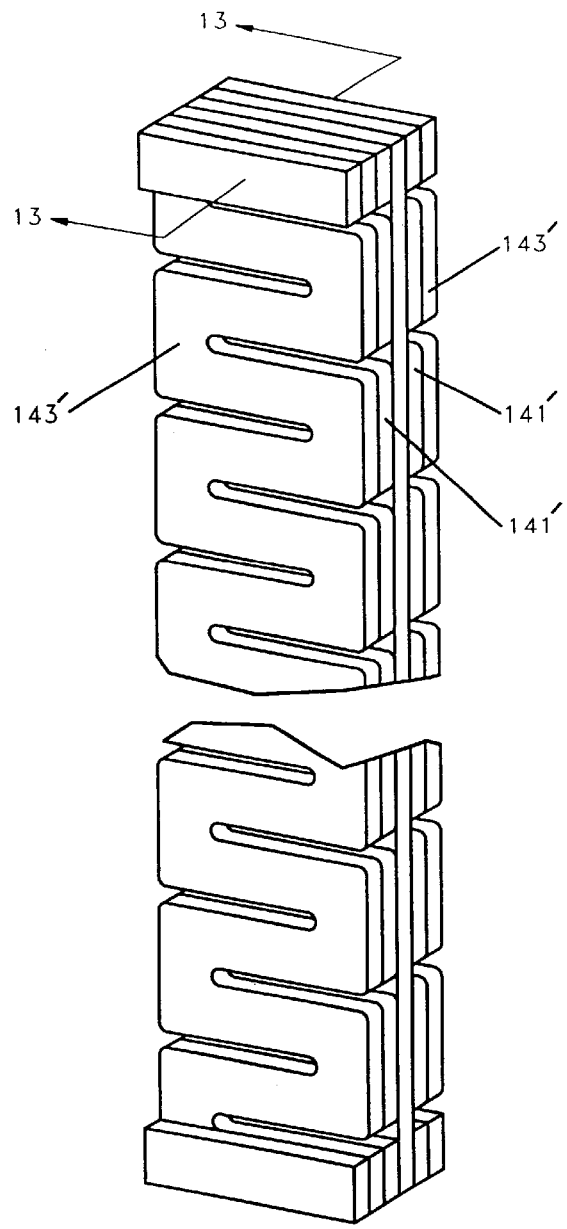
FIG. 12 is a diagonal view of one of the strips shown in FIG. 2 according to a different embodiment of the invention.
Figure 13:
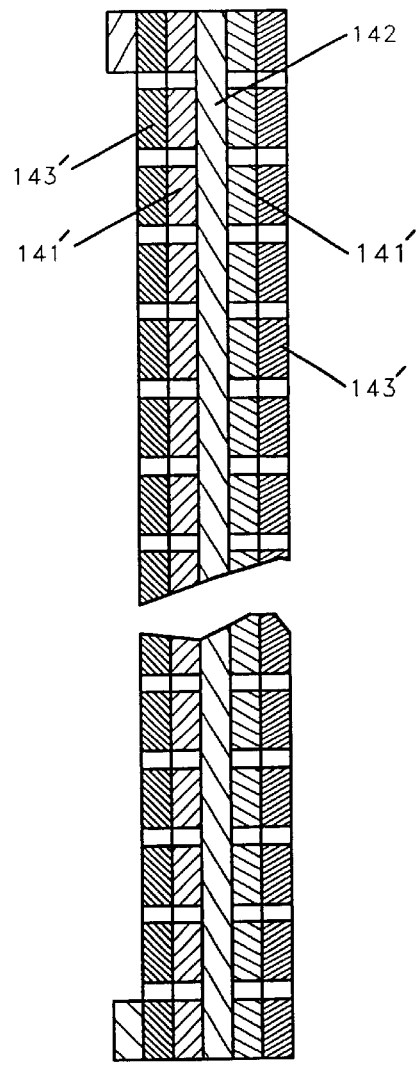
FIG. 13 is a sectional view taken along line 13—13 of FIG. 12.

Although the invention has been described above with reference to only a limited number of examples, these examples are not intended to limit the scope of the invention. Many modifications and variations are possible within the scope of the invention. With reference to FIG. 2, the plurality of strips 14 need not be distributed at azimuthally equal intervals. According to still another embodiment of this invention, each strip 14 as shown in FIG. 2 may be structured as shown in FIGS. 12 and 13, that is, having a HTS layer 141' formed on each surface of the substrate 142 of a material with a low dielectric loss (or having two HTS layers 141' ). Moreover, each HTS layer 141' is patterned (for example, by an etching process of a known kind) in a wavy form to provide a desired inductive characteristic so as to provide a so-called TEM mode resonator. (Article by Han Wen et al. entitled "The Design and Test of a New Volume Coil for High Field Imaging" published in 1994 MRM 32:492–498.) The two wavy patterns on mutually opposite surfaces of the substrate 142 should not overlap each other completely when seen perpendicularly to the surface of the substrate (and through the substrate) such that no significant capacitance is formed therebetween. FIG. 12 shows that the two wavy, serpentine patterns on the different surfaces of the substrate 142 meander in a mutually off-phase relationship with respect to each other. In FIGS. 12 and 13, numerals 143' indicate protective layers of a material and for the purpose as described above with reference to FIG. 3.

In the description of the invention above, specific HTS materials are not intended to limit the scope of the invention, and the number of strips in each embodiment may be varied, depending on the purpose for which the coil is used. Advantages gained by this invention include those of HTS materials over prior art conductive materials such as copper and those of birdcage coils over coils of ordinary structure, which have already been noted. It is noteworthy that in the second embodiment of the invention described above with reference to FIGS. 4, 5 and 6 even the ring elements as parts of the birdcage structure are formed with a HTS material instead of a prior art conductive material such as copper. Capacitors of conventional types are hereby replaced by those formed with a pair of HTS films sandwiching a sapphire substrate. Thus, superconducting coils of this invention can serve more reliably with an improved signal-to-noise ratio, for example, in MRI applications by combining the advantages of both HTS materials and the birdcage coil structure.

What is claimed is:

1. A superconducting resonance birdcage coil comprising:
    a pair of electrically conductive ring elements separated in a longitudinal direction; and
    a plurality of elongated members made with a superconducting material and extending in said longitudinal direction and interconnecting said ring elements at junctions spaced therebetween along eripheral surfaces of said ring elements, each said elongated member comprising a substrate having two mutually opposed surfaces with a portion of a high temperature superconductor (HTS) layer formed on at least one said surface thereof in a wavy temperature super conductor (HTS) layer formed on at least one said surface thereof in a wavy pattern grown thereon, said HTS layer and said ring elements sandwiching said substrate at each of said junctions to form a built-in capacitor with a predetermined capacitance made with spuerconducting material for providing resonance.

2. The superconducting coil of claim 1 is a low-pass coil.

3. The superconducting coil of claim 2, wherein said substrate is made of a low loss dielectric material having a crystal structure matching to a crystal structure of said HTS layer.

4. The superconducting coil of claim 3, wherein said substrate is made of sapphire.

5. The superconducting coil of claim 3, wherein each said wavy patterned HTS layer has a predetermined inductance.

6. The superconducting coil of claim 5, wherein each said wavy patterned HTS layer includes capcitance-providing end areas with a curving portion therebetween, said each areas are retracted from edges of said substrates.

7. The superconducting coil of claim 2, wherein each said elongated member further comprising a protective layer of an electrically conductive material covering said HTS layer.

8. The superconducting coil of claim 2, wherein each said elongated member comprises two HTS layers respectively formed onto said two mutually opposed surfaces of said substrate.

9. The superconducting coil of claim 8, wherein each said wavy patterned HTS layer has a predetermined inductance.

10. The superconducting coil of claim 9, wherein each said HTS layer is covered by a protective layer of an electrically conductive material.

11. The superconducting coil of claim 9, wherein said HTS layers are patterned so as to minimize a capacitance therebetween.

12. The superconducting coil of claim 2 is a magnetic resonance coil.

13. The superconducting coil of claim 1, wherein said wavy pattern is a serpentine pattern including 180° degree turns each with a smoothly rounded inner edge.

14. A superconducting resonance birdcage coil comprising:
    a plurality of planar separated therebetween elongated members made with a superconducting material and disposed sequentially around and extending radially from a central axis,
    each said elongated member comprising a substrate having a first and a second main surfaces, said first main surface being opposite to said second main surface,
    a high temperature superconductor (HTS) layer formed on said first surface, and
    a pair of high temperature superconductor (HTS) electrodes formed at two respective opposite spots of said second main surface, said HTS layer and said HTS electrodes forming a built-in capacitor with a predetermined capacitance therebetween made of superocnducting material, a capacitance between one said HTS layer of one said elongated member and said HTS electrodes of adjacent thereto elongated member being larger than the predetermined capacitance between said layer and said electrodes of one said elongated member.

15. The superconducting coil of claim 14 is a high-pass coil.

16. The superconducting coil of claim 15, wherein said substrate is made of a low loss dielectric material having a crystal structure matching to a crystal structure of said HTS layer.

17. The superconducting coil of claim 16, wherein said substrate is made of sapphire.

18. The superconducting coil of claim 17 is a magnetic resonance coil.

* * * * *